United States Patent
Engh et al.

[11] Patent Number: 6,081,603
[45] Date of Patent: Jun. 27, 2000

[54] METHOD AND APPARATUS FOR AUTOMATIC GAIN CONTROL USING A LINEAR LIMITER CIRCUIT WITH VOLTAGE CONTROLLED RESISTORS AS A VARIABLE ELEMENT

[75] Inventors: Lawrence D. Engh, Redwood City; Jung Sheng Hoei, Newark; Vishal Sarin, Santa Clara, all of Calif.

[73] Assignee: Information Storage Devices, Inc., San Jose, Calif.

[21] Appl. No.: 08/925,022

[22] Filed: Sep. 8, 1997

[51] Int. Cl.[7] .................................................. H03F 21/00
[52] U.S. Cl. ................... 381/120; 381/108; 455/232.1; 455/234.1; 455/240.1; 330/282
[58] Field of Search .................................. 381/104, 106, 381/107, 108, 120; 455/232.1, 234.1, 240.1, 219; 330/260, 282; 341/153, 154

[56] References Cited

U.S. PATENT DOCUMENTS

| 4,890,259 | 12/1989 | Simko . | |
|---|---|---|---|
| 5,241,494 | 8/1993 | Blyth et al. . | |
| 5,412,346 | 5/1995 | Burger, Jr. et al. | 330/282 |
| 5,546,458 | 8/1996 | Iwami | 379/390 |
| 5,699,016 | 12/1997 | Federspiel et al. | 330/260 |
| 5,822,442 | 10/1998 | Agnew et al. | 381/107 |
| 5,862,238 | 1/1999 | Agnew et al. | 381/321 |

*Primary Examiner*—Forester W. Isen
*Assistant Examiner*—Debra A. Lemm
*Attorney, Agent, or Firm*—Blakely, Sokoloff, Taylor & Zafman LLP

[57] ABSTRACT

The present invention relates to a method and apparatus for adjusting the gain of an amplifier circuit. A gain control circuit compares the output of the amplifier with a reference voltage and adjusts a variable resistor, thereby altering the gain of the amplifier.

21 Claims, 4 Drawing Sheets

METHOD AND APPARATUS FOR AUTOMATIC GAIN CONTROL USING A LINEAR LIMITER CIRCUIT WITH VOLTAGE CONTROLLED RESISTORS AS A VARIABLE ELEMENT

BACKGROUND OF THE INVENTION

1. Field of the Invention

The present invention relates to the field of signal processing. More specifically this invention relates to gain control in an amplifier circuit.

2. Description of Related Art

Gain control is an important part of preventing distortion in systems in which an amplifier must handle a wide range of inputs. Improper gain control can result in clipping or distortion of the amplifier output signal. One application in which amplifiers process a wide range of inputs is in the processing of sound signals. For example, an electrical signal generated from a human voice may vary in signal strength depending on the person being recorded, the language used and, the position of the speaker with respect to a microphone. Typically, these voice signals are received by commercially available microphones which output signals varying from hundreds of microvolts to hundreds of millivolts. A pre-amplifier may be used to amplify the signals before input into a second stage amplifier. An automatic gain control circuit adjusts the pre-amplifier increasing gain when voice signals are weak and decreasing gain when voice signals are strong to prevent overdriving the second stage amplifier.

One arrangement for implementing a gain control circuit in an amplifier system is shown in FIG. 1. In FIG. 1, a sound signal is received by a microphone 104 which converts the sound signal into an electrical signal. A preamplifier 108 amplifies the electrical signal into a range appropriate for a more powerful amplifier 112 typically a second stage amplifier. Processing circuitry 116, 120, such as analog anti-aliasing filters 116 process the output of amplifier 112. A peak detector 124 also receives the amplifier output signal. The peak detector detects a local peak of the amplifier output signal 112 and generates a peak indicator signal. An automatic gain control circuit (AGC) 128 receives the peak indicator signal and outputs a control signal used to adjust the gain in an amplifier. The amplifier may be a preamplifier 108 or the second stage amplifier 112.

In a prior art circuit implementation of a peak detector, an AGC control circuit and a pre-amplifier, the peak detector circuit inputs the output from amplifier 112 into an operational amplifier within the peak detector 124. The peak detector 124 uses a combination of operational amplifiers and transistors to generate an output voltage corresponding to the peak of the signal received by the peak detector.

The output voltage, $V_{AGC}$, of the peak detector 124 is input into AGC control circuit 128. Typically the AGC control circuit uses a plurality of transistors to compare the voltage $V_{AGC}$ with a reference voltage VDet to generate an AGC control signal. The AGC control signal is related to the difference between $V_{AGC}$ and the reference voltage $V_{Det}$.

A pre-amplifier 108 uses the AGC control signal to adjust the gain of pre-amplifier 108. The gain of pre-amplifier 108 typically can be computed from the transconductance of transistors within the preamplifier. The transconductance of these preamplifier transistors multiplied by the resistance of a load resistor typically determines the gain of the pre-amplifier. The transconductance of the transistors in the preamplifier is a function of the current flowing through the transistors. The current flowing through the preamplifier is a function of the output of the peak detector 124. Thus the gain of the pre-amplifier depends on the output of the peak detector 124. As the output from the peak detector increases, the gain of the pre-amplifier 108 decreases. Typical prior art gain control devices are described in detail in U.S. patent application Ser. No. 5,241,494 issued to Blyth, et al. and U.S. Pat. No. 4,890,259 issued to Simko.

One problem with the previously described prior art technique for implementing an AGC control is that the allowable dynamic range of the microphones 104 into the preamplifier 108 is very limited. When large over drive signals are applied to the input of the pre-amplifier, (large over drive signals being defined as on the order of tens of millivolts) severe distortion is created and signal integrity is significantly degraded.

A second problem with standard pre-amplifier gain control designs is that the maximum signal gain is not very well controlled. This is because the transconductance ($G_M$) of preamplifier transistors and the output load resistor which together determine the gain of the pre-amplifier do not track each other. The resistance of the load resistor and the $G_M$ of pre-amplifier transistors depend on independent process parameters, thus substantial variations in production occurs. Either of these components may have as much as a 30% variation due to variations in process parameters.

Thus it is desirable to have a method and apparatus for controlling the gain of the preamp stage which is able to handle wide dynamic ranges while offering improved control of the gain.

SUMMARY OF THE INVENTION

A method and apparatus for adjusting the gain in an amplifier or pre-amplifier is described. Variable resistors within the pre-amplifier are electrically adjusted by a gain control circuit to prevent over-driving of an amplifier receiving the output of the pre-amplifier. In one embodiment of the invention, variable resistors in the gain control circuit are adjusted after comparing an input signal with a reference signal. Corresponding variable resistors in the pre-amplifier track the variable resistors in the control circuit preventing overloading of the amplifier.

BRIEF DESCRIPTION OF THE DRAWINGS

The advantages of the present invention will become more readily apparent to those ordinarily skilled in the art after reviewing the following detailed description and accompanying drawings, wherein.

DETAILED DESCRIPTION OF THE INVENTION

In the following description and illustration, a number of conventions will be used for convenience. For example, metal oxide semiconductor (MOS) transistors are used in the circuit embodiments described. A number of voltages will also be given for illustrative purposes. It is to be understood that the particular circuit layouts, the voltages used, and the use of MOS transistors is done for illustrative purposes to facilitate understanding only and that one of ordinary skill in the art may vary the design parameters and still remain within the scope of the invention.

Figure 1:
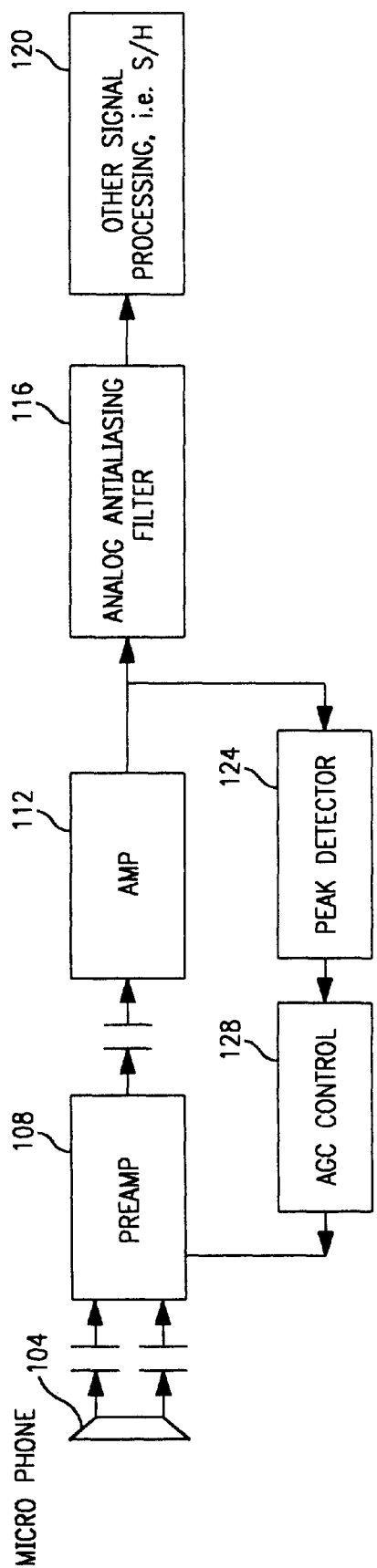
FIG. 1 is a block diagram of a system utilizing an AGC control circuit to control a preamplifier.
Figure 2:
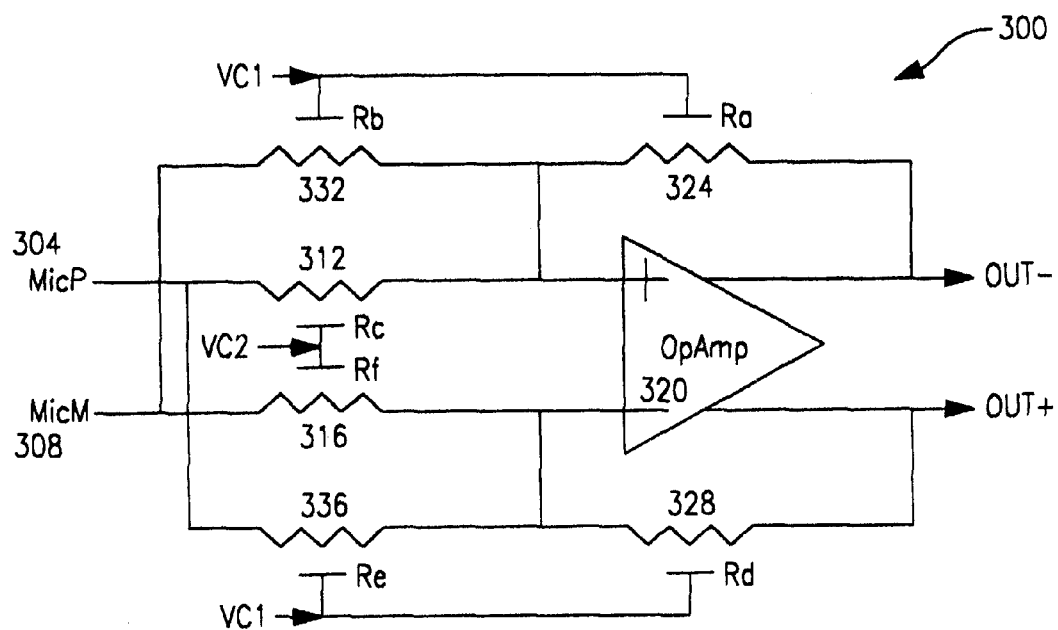
FIG. 2 is one embodiment of a preamp of the current invention.

FIG. 2 illustrates one example of a preamplifier 300 used in the present invention. The preamp circuit 300 receives the positive output 304 and the negative output 308 signals from the microphone 104 as illustrated in FIG. 1. Each microphone output signal is applied to a corresponding terminal of MOS variable resistors 312 and 316 as illustrated in FIG. 2. The opposite terminal of the variable resistors 312, 316 are coupled to the inputs of a pre-amplifier operation amplifier (Pre-Amp Op-Amp) 320.

Variable resistor 312 and variable resistor 316 are electrically adjustable. In one embodiment variable resistor 312 and variable resistor 316 are MOS resistors. Each gate of each variable resistors 312, 316 is coupled to a voltage source. The voltage applied to the gate determines the resistance of the variable resistors. In one embodiment of the present invention, the control circuit 128, of FIG. 1 generates a control signal which is applied to the gates of variable resistors 312, 316 in the pre-amplifier.

In the embodiment shown, resistors 324, 328 couple each output of pre-amp op-amp 320 to a corresponding input of pre-amp op-amp 320. The resistances of resistors 324, 328 are typically kept constant. To facilitate fabrication of the pre-amp 300, the constant resistors are typically MOS resistors with gates connected to a constant voltage source VC1. Two other constant resistors 332, 336 couple each input of pre-amp op-amp 320 to a corresponding microphone input. In the embodiment shown, microphone positive input 304 is coupled to a negative input of pre-amp op-amp 320 via constant resistor 336 and negative microphone input 308 is coupled to a positive input of pre-amp op-amp 320 via constant resistor 332. In the illustrated implementation constant resistors 332, 336 are also fabricated by coupling the gates of MOS resistors to the same constant voltage source, VC1.

The preamp circuit 300 produces a gain equal to: (the resistance of resistor 324 divided by the resistance of resistor 332) times the positive microphone input plus (the resistance of 324 divided by the resistance of variable resistor 312) times the negative microphone input. This may be expressed as:

$$V_{out} = -(R_a/R_c) \times V_{micp} + (R_a/R_b) \times V_{micm}.$$

If the Vmicp and Vmicm are symmetrical around a reference voltage, the gain of the preamp may be expressed as the absolute value of (Ra/Rc)−(Ra/Rb). The gain of the preamp is thus the difference of two ratios. The gain of this amplifier can be controlled over a very wide range with the maximum gain well defined.

The second term of the gain equation, Ra/Rb is a constant because the gates of both resistors Ra 324 and Rb 332 are tied to a constant voltage VC1. The value of the constant resistance is a function of the MOS dimensions including channel length and width. In one embodiment, the dimensions of the MOS resistors Ra and Rb differ such that the second term of the gain equation (Ra/Rb) is 24.

The first term of the gain equation adds the ratio of the resistance of constant resistor Ra 324 divided by variable resistor Rc 312. Thus when variable resistor Rc 312 is a large value, the overall gain is maximized. In the above mentioned embodiment, the maximum gain occurs when Rc is set to a resistance double Rb. This condition gives a ratio Ra/Rc of 12 and the gain is 12−24 which is a gain of 12, for an absolute value of 12. When variable resistor Rc 312 is set to a resistance equal to Rb, the overall gain is minimized. When the two ratios are almost equal, the gain is near zero.

In one embodiment, the dimensions (the length and the width of the channel in the MOS resistor) of constant resistor Rb 332 is the same as the dimensions of variable resistor Rc 312. Thus when control signal voltage, VC2, is equal to the constant reference voltage, VC1, the gain of the Amplifier 320 is zero because the second term of the equation, Ra/Rb is equal to the first term Ra/Rc. Thus reducing variable resistance Rc increases the term Ra/Rc of the gain equation, decreasing the overall gain of the preamplifier. By varying a control signal VC2 which controls variable resistors 312 and 316, the gain of the preamp circuit 330 can be adjusted.

Figure 3:
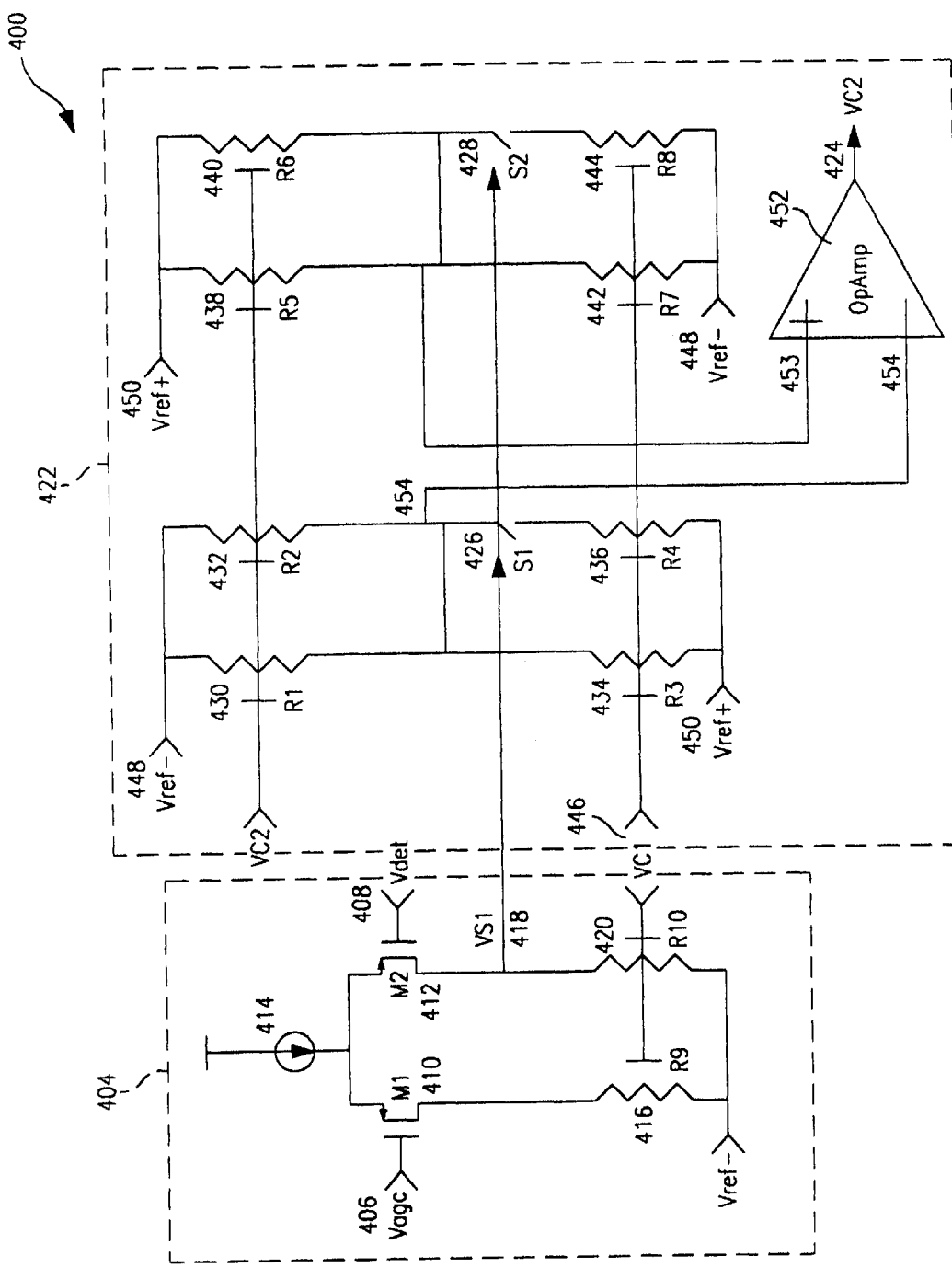
FIG. 3 is one embodiment of an AGC control circuit used to control a pre-amp of FIG. 2.

FIG. 3 illustrates an appropriate automatic gain control circuit 400 (AGC control circuit) for generating the control signal VC2. A comparator section 404 of the illustrated AGC control circuit 400 compares the output from the peak detector 406 $V_{AGC}$ with a reference voltage 408 $V_{DET}$. The comparison is done by applying $V_{AGC}$ to a gate of a first comparison transistor 410 and applying $V_{DET}$ 408 to a gate of a second comparison transistor 412. The ratio of current driven by a current source 414 between the two comparison transistors 410, 412 is determined by the relative voltage of $V_{AGC}$ 406 with respect to $V_{DET}$ 408. When $V_{AGC}$ is less than $V_{DET}$ most of the current flows through transistor 410 and variable resistor R9 416 resulting in minimal current through resistor 420. Minimal current through resistor 420 results in a low voltage VS1 at node 418 and switch S1 being open. As $V_{AGC}$ begins to rise with respect to comparison $V_{DET}$, comparison transistor 410 begins to turn off and more current flows through comparison transistor 412 resulting in increased current flow through resistor 420 and a rise in the voltage VS1 418. A rising voltage VS1 causes switches (S1, S2) 426, 428 to change states.

The AGC control circuit 400 generates a control signal VC2 on output 424 based on the comparator circuit 404 output VS1 418.

Comparator output VS1 418 is coupled to switches 426, 428. Each switch 426, 428 is coupled to four resistors including two variable resistors and two constant resistors. In particular, switch 426 is coupled to variable resistors 430, 432 and constant resistors 434, 436 while switch 428 is coupled to variable resistors 438, 440 and constant resistors 442, 444.

In the illustrated embodiment, all resistors in the AGC control circuit including the constant resistors 434, 436, 442, 444 and the variable resistors 430, 432, 438, 440 are MOS resistors having the same dimensions (channel width and length). Thus constant resistors 434, 436, 442, 444 have the same constant resistance because the voltage VC1 446 input to each gate of each constant transistor 434, 436, 442, 444 is a constant. Variable resistors 430, 432, 438, 440 vary together because the gates of the MOS variable resistors 430, 432, 438, 440 are together connected to a changing control signal VC2 voltage. Variable resistors 430, 432 are coupled to a negative voltage reference 448 while variable resistors 438, 440 are coupled to a positive voltage reference 450. Constant resistors 434, 436 are coupled to a positive reference voltage 450 while constant resistors 442, 444 are coupled to negative voltage reference 448.

In the following description, voltage values will be used as examples to facilitate the description and understanding of the AGC control circuit 400 operation. However it is understood that these values are exemplary values and other values may be used.

In an initial state of the AGC control circuit 400, the input voltage from the peak detector $V_{AGC}$ is less than approximately 1.5 volts, while the reference voltage $V_{DET}$ may be approximately 1.8 volts. Analog ground is chosen to be around 1.5 volts. Negative voltage reference 448 and positive voltage reference 450 are equidistant around the analog ground, thus if the analog ground is 1.5 volts, a typical negative voltage reference is 1 volt and a suitable positive voltage reference 450 may be around 2 volts. A typical $V_{C1}$ is around 2.5 volts. The initial control signal output, VC2 initially may be around 2 volts.

During operation, control circuit Op amp 452 adjusts output VC2 to eliminate voltage differences between input to control circuit Op-Amp positive terminal input 453 and negative terminal input 454. In an initial turn-off stage, the input from the peak detector 124 of FIG. 1 is below the reference voltage $V_{DET}$. Thus the voltage VS1 at node 418 is at a low value and switches 426, 428 (S1, S2) are open preventing current flow through resistors 436, 444. In order to equalize the voltages of the positive input terminal 453 and the negative input terminal 454 of control circuit op amp 452, the voltages at node 454 and 453 must be kept equivalent. Keeping voltage at nodes 454, 453 equivalent requires that the voltage at nodes 454 and 453 be maintained midway between the negative voltage reference 448 and the positive voltage reference 450 or that the resistances of the parallel combination of variable resistors 430, 432 be kept equal to the parallel combination of constant resistance 442, 444. Likewise, the resistance of the parallel combination of variable resistors 438, 440 must be kept equal to the parallel combination of constant resistors 434, 436. When switches 426 and 428 are open, the resistance of resistor 434 (R3) must equal resistance of the parallel combination of variable resistors 438, 440 (R5, R6). The resistance of resistor 442 (R7) must also equal the resistance of the parallel combination of resistors 430, 432 (R1, R2). A feed back loop feeds the output of the AGC control circuit to variable resistors 430, 432, 438, 440. Thus the AGC control circuit adjusts the output to satisfy the required resistor equivalence of the AGC control circuit.

The control signal VC2 also controls the resistances of variable resistors 312, 316 in preamp 300 and the variable resistors 430, 432, 438, 440 in AGC control circuit 400. Thus all variable resistors in the pre-amp 300 and the AGC control circuit 400 "track" each other by having the same resistance.

When $V_{DET}$ is greater than the voltage from the peak detector $V_{AGC}$, the switches S1 and S2 are open. To satisfy the requirement that the parallel combination of variable resistor 430, 432 has the same resistance as one constant resistor 442, each variable resistor must have half the resistance of constant resistor 442. When the variable resistance is equal to half the constant resistance, the second term of the gain equation is 12. Subtracting the second term (12) from the first constant term (24) of the gain equation results in an overall gain of 12.

As an output of the amplifier slowly rises, the voltage from the peak detector ($V_{AGC}$) also rises and changes the relative current flowing through transistor 410 and 412 in comparator 404. The increasing current through transistor 412 raises voltage VS1 418 gradually closing the switches 426, 428. Closing switches 426, 428 reduces the effective resistance of resistor pairs 434, 436 and resistor pairs 442, 444. In order to maintain equivalent voltages at nodes 454,

453, the resistance of resistors pairs 430, 432, and 438, 440 must also be reduced. Increasing the voltage VC2 in the feedback loop reduces the resistance of variable resistors 430, 432, 438, 440 maintaining equivalent voltages at nodes 454, 458.

When $V_{AGC}$ is significantly above the reference voltage $V_{DET}$, the switches 426, 428 are completely closed. The similar dimensions of variable resistors 430, 432, 438, 440, and of constant resistors 434, 436, 442, 444 result in a VC2 equal to VC1.

In the pre-amp circuit of FIG. 2, the dimensions of variable resistors 312, 316 are equal to the dimensions of constant resistors 332, 336. Setting VC1 equal to VC2 changes the resistances of the variable resistors 312, 316 ($R_C$, $R_F$) to equal the resistance of constant resistors 332, 336 ($R_B$, $R_E$). Under these conditions, the second term of the gain equation becomes the same as the first term of the gain equation resulting in an overall gain of 0. Thus as the input voltage increases, the gain of the amplifier is reduced.

Figure 4:
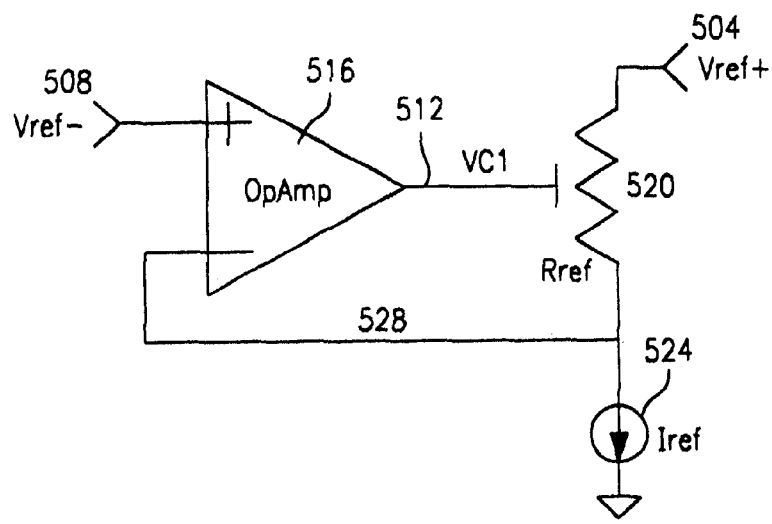
FIG. 4 is one embodiment of a circuit to generate a reference voltage used by the AGC control circuit of FIG. 3.

FIG. 4 illustrates a circuit for generating a positive reference voltages Vcl using $V_{REF}$+504 and a negative voltage $V_{REF}$–508. The potential at $V_{REF}$+504 and $V_{REF}$–508 are an equal distance from a common analog ground. The circuit of FIG. 4 generates the constant voltage VC1 512 used in the circuits of FIG. 2 and FIG. 3. In FIG. 4, the output of a reference op-amp 516 is coupled to a gate of a MOS resistor 520. An input of the reference Op-Amp 516 and a terminal for the MOS resistor 520 are coupled to a constant current source 524. A second input of the Op-Amp 516 is maintained at a reference voltage, $V_{ref}$. As constant current source 524 pulls current through resistor 520, Op-amp 516 maintains its output VC1 to adjust the resistance of MOS resistor 520 such that $V_{ref}$ is approximately equal to the first input 508 of the Op-Amp 526.

Figure 5:
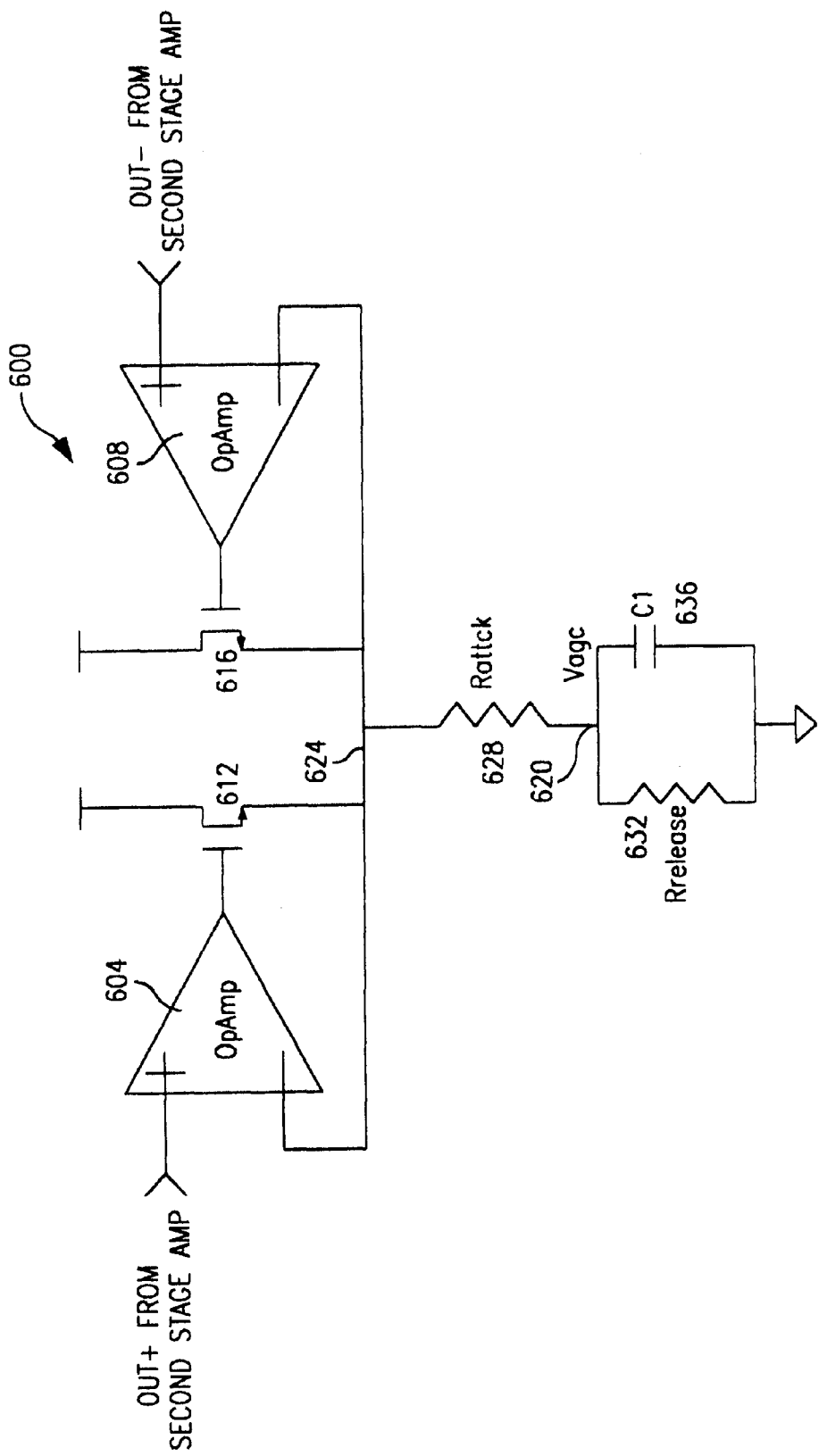
FIG. 5 is one embodiment of a circuit for performing full-wave peak detection.

FIG. 5 illustrates a full wave peak detector 600 used as the peak detector 124 of FIG. 1. The full wave peak detector 600 includes two Op-Amps 604, 608. Op amp 604 receives a positive signal from the second stage amplifier and a second op amp receives the negative portion of the signal from the second stage amplifier. Each op amp 604, 608 output is coupled to the gate of a corresponding transistor 612, 616. The output voltage 624 is common to each of the peak detector circuits with only one of them active at any time. Since the peak of both the positive and negative extremes are used, the resulting voltage 620 is smoother and causes less signal distortion then a single peak detector.

The peak output of the peak detector at node 620 can be determined by performing voltage division on the peak voltages generated at the outputs of each op amp 604, 608 (at nodes 624) between resistor 628 and resistor 632. The voltage divider steps down the voltage to an appropriate value to produce voltage $V_{AGC}$. $V_{AGC}$ slowly decreases from the peak value by an RC time constant determined by resistor 632 in parallel with capacitor 636.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A gain control apparatus comprising:
   an amplifier system including a first operational amplifier coupled to a first variable resistor, a gain of the amplifier system electrically adjusted using said first variable resistor; and a gain control circuit including a second electrically variable resistor and a second operational amplifier, said second operational amplifier outputs a gain control signal to adjust a resistance of the first variable resistor and the second electrically variable resistor.

2. The gain control apparatus of claim 1 wherein said first variable resistor is a voltage controlled metal oxide semiconductor resistor.

3. The gain control apparatus of claim 1 further comprising:
a feedback loop coupling an output of said amplifier system to an input of said amplifier system, said feedback loop including said gain control circuit.

4. The gain control apparatus of claim 3 wherein the feedback loop further includes a peak detector, the output of said peak detector coupled to an input of said gain control circuit.

5. The gain control apparatus of claim 1, wherein said first variable resistor and said second variable resistor are MOS resistors having the same dimensions and coupled such that the resistance of said first variable resistor tracks said second variable resistor.

6. The gain control apparatus of claim 1 further comprising:
a switch and a third variable resistor connected in parallel with said second variable resistor, said switch closing when the first operational amplifier output exceeds a predetermined value.

7. A method of sound processing comprising:
converting a sound signal to an electrical signal;
amplifying the electrical signal with an amplifier circuit;
detecting a peak amplitude of the electrical signal;
adjusting a first variable resistor in the amplifier circuit based on the detected peak amplitude, said adjusting of said first variable resistor altering a gain of said amplifier circuit;
receiving the peak amplitude of the electrical signal in a gain control circuit;
changing a second variable resistor within the gain control circuit based on an output of the gain control circuit; and
transmitting the output of the gain control circuit to the amplifier circuit.

8. The method of claim 7 wherein said adjusting of said first variable resistor is performed by altering an electrical voltage to a gate of a metal oxide semiconductor resistor.

9. The method of claim 7 further comprising analog antialiasing filtering the output of the amplifier.

10. A system for processing sound waves comprising:
a detecting device that converts audio waves into electrical signals;
an amplifier unit that amplifies the electrical signal to produce an amplified signal;
a peak detector that determines a peak amplitude of the amplified signal and outputs a voltage corresponding to the peak amplitude; and
a gain control device that receives the voltage corresponding to the peak amplitude and adjusts a variable resistor in the amplifier to adjust the gain of the amplifier.

11. The system of claim 10 wherein the amplifier is a pre-amplifier, an output of said pre-amplifier is input into a main amplifier before transmission to the peak detector.

12. The system of claim 10 wherein a gain control signal output by the gain control device is used in a feedback loop to adjust a variable resistor in the gain control device, the gain control signal also used to adjust the variable resistor in the amplifier to limit gain.

13. The system of claim 10 wherein the adjustable variable resistor is a metal oxide semiconductor resistor.

14. An amplification system comprising:
an operational amplifier including a first input, a second input, a first output and a second output;
a first resistor maintained at a constant resistance coupling the first input to the first output;
a second resistor maintained at a constant resistance coupling the second input to the second output;
a first variable resistor coupling the first input to a first terminal of a microphone;
a second variable resistor coupling the second input to a second terminal of a microphone
a third resistor maintained at a constant resistance coupling the first input to the second terminal; and
a fourth resistor maintained at a constant resistance coupling the second input to the first terminal;
wherein said first, second, third, and fourth resistors variable resistors are maintained at a constant value by application of a constant controlling voltage.

15. The amplification system of claim 14 wherein the first input of the operational amplifier is a non-inverting input and the second input of the operational amplifier is an inverting input.

16. The amplification system of claim 14 wherein the first variable resistor and the second variable resistor are metal oxide semiconductor resistors which change resistance based on an applied voltage.

17. A gain control circuit comprising:
a comparator circuit, which compares voltage levels from a reference voltage and an input signal;
at least one switch coupled to the output of the comparator circuit, the at least one switch switches according to whether the input signal is above or below the reference voltage;
an operational amplifier coupled to the at least one switch, said operational amplifier outputting a control signal; and
a first variable resistor changing resistance according to the control signal, the first variable resistor coupling an input to the operational amplifier to a second reference voltage.

18. The gain control circuit of claim 17 further comprising:
a second variable resistor coupled in parallel with said first variable resistor, said second variable resistor and said first variable resistor being metal oxide semiconductor resistors with a predetermined channel length and a predetermined channel width, a gate of said first variable resistor and a gate of said second variable resistor coupled to the control signal.

19. The gain control circuit of claim 17 further comprising:
a second variable resistor coupled in parallel with said first variable resistor and changing resistance according to the control signal;
a third resistor coupling the input to the operation amplifier to a third reference voltage;
a fourth resistor coupling the input to the operation amplifier to the reference voltage through a first of the at least one switch;
wherein said third and fourth resistors are variable resistors that are maintained at a constant value by application of a constant controlling voltage.

20. The gain control circuit of claim 19 further comprising:
   a second switch coupled to the output of the comparator circuit, the second switch switches according to whether the input signal is above or below the reference voltage;
   a fifth variable resistor changing resistance according to the control signal, the fifth variable resistor coupling a second input to the operational amplifier to the third reference voltage;
   a sixth variable resistor coupled in parallel with said fifth variable resistor and changing resistance according to the control signal;
   a seventh resistor coupling the second input to the operation amplifier to the second reference voltage; and
   an eighth resistor coupling the second input to the operation amplifier to the second reference voltage through the second switch;
   wherein said seventh and eighth resistors are variable resistors that are maintained at a constant value by application of the constant controlling voltage.

21. The gain control circuit of claim 19 wherein the input and the second input to the operation amplifier are inverting and non-inverting inputs, respectively.

* * * * *